United States Patent [19]

Izumi et al.

[11] Patent Number: 5,017,893
[45] Date of Patent: May 21, 1991

[54] MICROWAVE MODULATOR

[75] Inventors: Tetsujirou Izumi; Akihiko Iida, both of Ichikawa, Japan

[73] Assignee: Robotech Laboratory Co., Ltd., Tokyo, Japan

[21] Appl. No.: 483,566

[22] Filed: Feb. 22, 1990

[30] Foreign Application Priority Data

Mar. 10, 1989 [JP] Japan .................................. 1-58895

[51] Int. Cl.$^5$ .............................................. H03C 7/02
[52] U.S. Cl. ...................................... 332/103; 375/67
[58] Field of Search ................ 332/103, 144; 455/111; 375/67

[56] References Cited

PUBLICATIONS

Yamamoto, H. et al., "20 GHz Band PIN Diode High--Speed Quadriphase Modulator", *Review of Electrical Communication Laboratories (Japan)*, vol. 25, No. 3-4, Mar.-Apr. 1977, pp. 343-352.
"Digital Microwave Communication", M. Kuwabara, pp. 106-109, Published (in Japanese) May 25, 1984, Jan. 1988.

Primary Examiner—David Mis
Attorney, Agent, or Firm—McAulay Fisher Nissen Goldberg & Kiel

[57] ABSTRACT

A waveguide modulation circuit branches a first short circuit from a main waveguide and branches a second short circuit from the first short circuit. The second short circuit is branched by an H-plane slit coupling at a position distant from the short-terminal of the first short circuit by a length of a half wavelength or some multiples thereof and this second short circuit is short-circuited or conductively terminated at a length of a half wavelength or some muliples thereof distant from its branch point. In the second short circuit, a switching diode is loaded at a predetermined position distant from the short-terminal towards the branch point. A pulse train of the modulation signal is appled to this diode to attain a 2-phase PSK-modulation circuit. A wave absorber may be attached to the short-terminal of the first short circuit, whenever necessary. A 4-phase PSK signal can also be obtained.

5 Claims, 4 Drawing Sheets

MICROWAVE MODULATOR

BACKGROUND OF THE INVENTION

1. Field of the Invention

This invention relates to a pathlength type microwave modulator using a waveguide.

2. Description of the Prior Art

Firstly, a microwave modulator according to the prior art will be explained with reference to FIG. 6. In FIG. 6, the microwave modulator includes a main waveguide GM which has a circulator C arranged in a path of the main waveguide GM and a short-circuiting waveguide GB which is branched at the circulator C. A diode D is loaded across H-planes of the branched waveguide GB at a position $\lambda_g/4$ (where $\lambda_g$ is a guide wavelength) distant from a short-terminal TS of the short-circuiting waveguide GB towards the circulator C. In the above arrangement, when a pulse signal is applied to the diode D as a modulation signal, a carrier inputted from an input port of the main waveguide GM (left end as viewed in FIG. 6) is subjected to 0-phase and $\pi$-phase modulation synchronized with ON-OFF switching operation of the diode D, so that a PSK signal is produced at an output port of the main waveguide GM (right end as viewed in FIG. 6) as a modulated output signal. The above arrangement is well known in the art.

However, the prior art shown in FIG. 6 involves the following problems.

(1) By loading the diode D, an insertion loss (about 2 dB in a millimetric wave, for example) arises in the OFF period of the diode D, and the loss becomes twice (about 4 dB) when the wave returns back reflected from the short-terminal TS. This results in a drawback arising in that amplitude modulation is imparted to the PSK-modulated output signal of the main waveguide GM because of the ON-OFF operation of the diode D.

(2) The short-circuiting effect of the diode D, when it is ON, is not so perfect so that there may be a wave reflected back from the short-terminal TS. This results in a drawback arising in that the amplitude and phase of the PSK-modulated output signal varies or in other words, a switching ratio of the output signals according to the 0-phase and $\pi$-phase output levels is deteriorated.

(3) There is another drawback in that the length of the short-circuiting waveguide GB is fixed, and it is difficult to adjust the frequency of a modulated signal on the output end and to make fine tuning.

SUMMARY OF THE INVENTION

It is a general object of the present invention to eliminate the above described drawbacks of the prior art modulator.

It is a specific object of the present invention to provide a pathlength type microwave modulator which equalizes as much as possible the level of the PSK-modulated output signal, independently of the conducting period and nonconducting period of the diode.

A fundamental structure of the modulation circuit according to the present invention resides in branching a first short circuit from a main waveguide and branching a second short circuit from the first short circuit. In this case, the second short circuit is branched by an H-plane-slit coupling at a position distant from the short-terminal of the first short circuit, by a half wavelength (guide wavelength) or some multiples thereof and this second short circuit is conductively short-terminated at a length of a half wavelength or some multiples thereof distant from its branch point. Furthermore, a switching diode is loaded on the second short circuit at a position apart from the short-terminal towards the branch point by a quarter wavelength or a length which is the sum of a quarter wavelength and some multiples of a half wavelength. A pulse train of the modulation signal is applied to this diode so as to attain a 2-phase PSK-modulation signal.

Furthermore, a wave absorber may be attached to the short-terminal of the first short circuit, whenever necessary. A loss amount of the carrier at this wave absorber must be regulated, as much as possible, to be equal to a loss amount of the carrier at the diode in the second short circuit in its OFF-state by suitable arrangement of the wave absorber thereof. Then the improvement of the equalization in level of the PSK-modulated output signals in the ON-state and OFF-state of that diode is enhanced as great as it can be.

A 4-phase PSK signal can also be obtained in the modulated output energy by cascading two sets of the modulation circuits having such a structure as stated above, and loading the diode of the second short circuit in one of the modulation circuits at a position of the second short circuit which is distant from its short-terminal by a ⅛ wavelength or a wavelength of a ⅜ wavelength and some multiples of the ½ wavelength.

These and other objects and features of the present invention will become more apparent from the following description when taken in conjunction with the accompanying drawings.

DETAILED DESCRIPTION OF THE PREFERRED EMBODIMENTS

Figure 1:
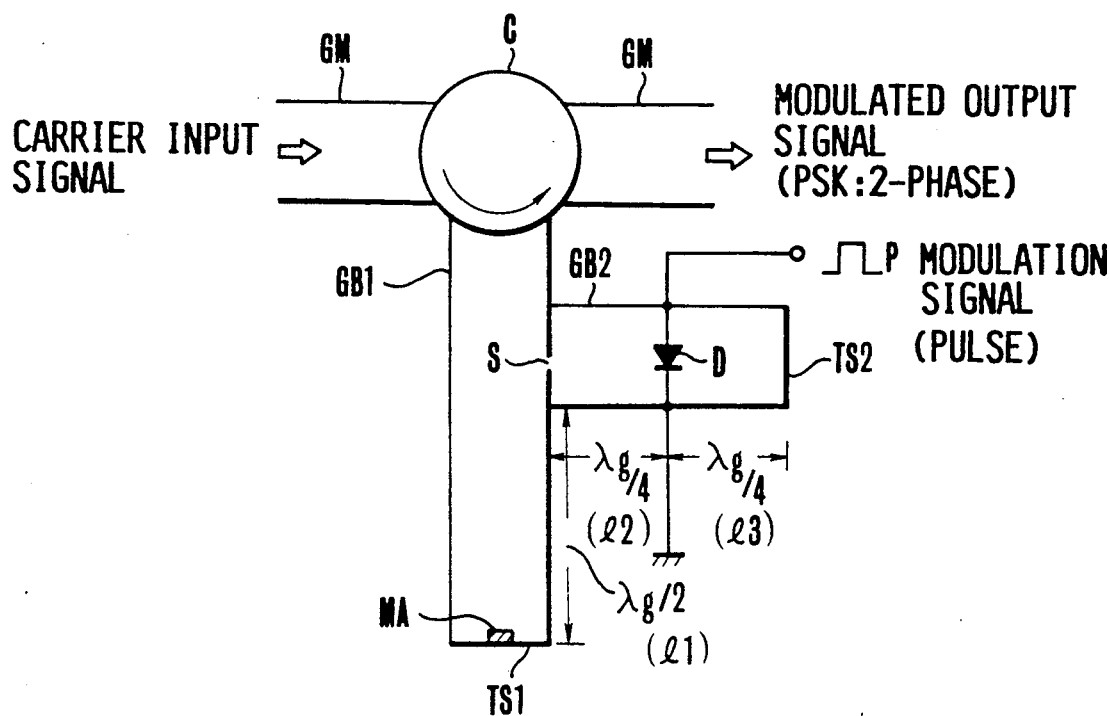
FIG. 1 is a structural circuit diagram showing a first embodiment of the present invention.

FIG. 1 shows a first embodiment of the present invention, which is directed to obtaining a 2-phase (0-phase and $\pi$-phase) PSK output signal by use of a rectangular waveguide. The embodiment is based on the premise that a $TE_{10}$ mode is used for the operation.

In the drawings, a branch point of the circuit and a loading point of a diode are represented by fractions of a guide wavelength $\lambda g$. The lengths indicated by symbols ($\lambda 1$), ($\lambda 2$) and ($\lambda 3$) represent the most simple case (m=1, n=0).

In FIG. 1 a microwave modulation circuit according to the present invention includes a main waveguide GM having a circulator C and a waveguide branched from the circulator C. The branched waveguide constitutes a first short circuit GB1 which is terminated at a first short-terminal TS1. The first short circuit GB1 has another branched waveguide. The latter branched waveguide is formed on one of H-planes of the first short circuit GB1 at a point returning back by a distance of $\lambda_g/2$ towards the circulator C from the first short-terminal TS1 by means of an E-plane-T-junction. This is conductively short-terminated at a position located at a length of $\lambda_g/2$ from its branched point. This waveguide branched from the first short circuit GB1 constitutes a second short circuit GB2 and its terminal constitutes a second short-terminal TS2.

In this case, the distance between the first short-terminal TS1 and an inner surface of a wall of the waveguide constituting the second short circuit GB2 which is located nearer to the first short-terminal TS1 is set to be $\lambda_g/2$.

Further in this case, the cross-sectional plane of the waveguide of the second short circuit GB2 coupled to the waveguide of the first short circuit GB1, at the position where the second short circuit GB2 is branched from the first short circuit GB1, is so arranged that the H-plane of the waveguide of the first short circuit GB1 is left as it is and a slit S is formed therein at a center of the coupling cross section, extending in cross-wise direction to the axis of the waveguide of the first short circuit GB1. In other words, this slit S is included in the cross-sectional coupling plane of the waveguide of the second short circuit GB2, and is formed in parallel with the major side of the cross-sectional coupling plane and is located at the center of the minor side of the coupling cross section.

In the second short circuit GB2 having such a structure, a diode D is loaded across the H-planes faced each other at the position distant from the second short-terminal TS2 by a length of $\lambda_g/4$ toward the branch point.

Figure 2:
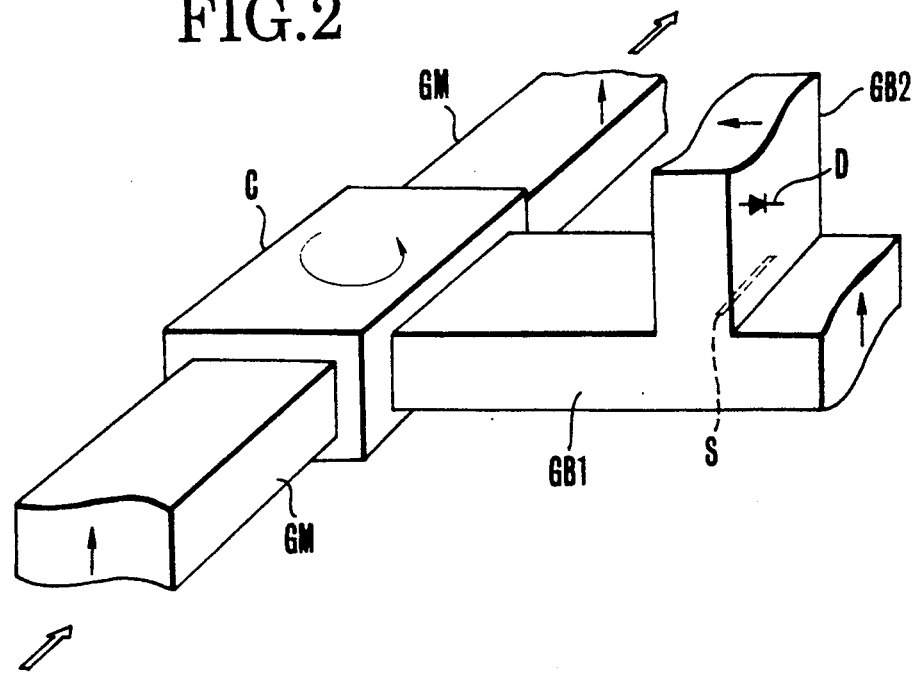
FIG. 2 is a partial perspective view showing a part of the solid, three dimensional structure of the first embodiment.

FIG. 2 shows a solid, three dimensional structure consisting of these main waveguide GM, circulator C, first short circuit GB1 and second short circuit GB2 having the structural relation described above, and the arrangement of the slit S and diode D disposed on them. In FIG. 2, however, each of the first and second short circuits GB1 and GB2 is shown as partly broken away and accordingly, the first and second short-terminals TS1 and TS2 do not appear in FIG. 2. Each black arrow represents in practical manner a line of electric force at each broken section. Since the practical structure of the circulator C is well known, it is arbitrary and is illustrated as hexahedral in FIG. 2.

As shown in FIG. 1 schematically, a wave absorber MA is attached to the first short-terminal TS1, whenever necessary.

In FIG. 1, when the diode D is turned ON (conductive) by the application of a pulse, this diode D functions as the conduction- and short-terminal. Accordingly, the carrier in the second short circuit GB2 is reflected at the loaded point under the conductive action of the diode D and the slit S is opened. When the diode D is turned OFF (nonconductive), the carrier is reflected from the second short-terminal TS2 and the slit S is short-circuited.

The distance between the slit S (at the input port of the second short circuit GB2) and the second short-terminal TS2 is $\lambda_g/2$ and the distance between the slit S and the diode D is $\lambda_g/4$. Consequently, the path length difference of the carrier in the second short circuit GB2 between the ON-state and the OFF-state of the diode D during one reciprocating travel of the carrier is $\lambda_g/2$, which results in a phase difference $\pi$. Accordingly, the PSK-modulated output signal is subjected to $(0,\pi)$-phase modulation with the ON-OFF operations of the diode D.

Figure 6:
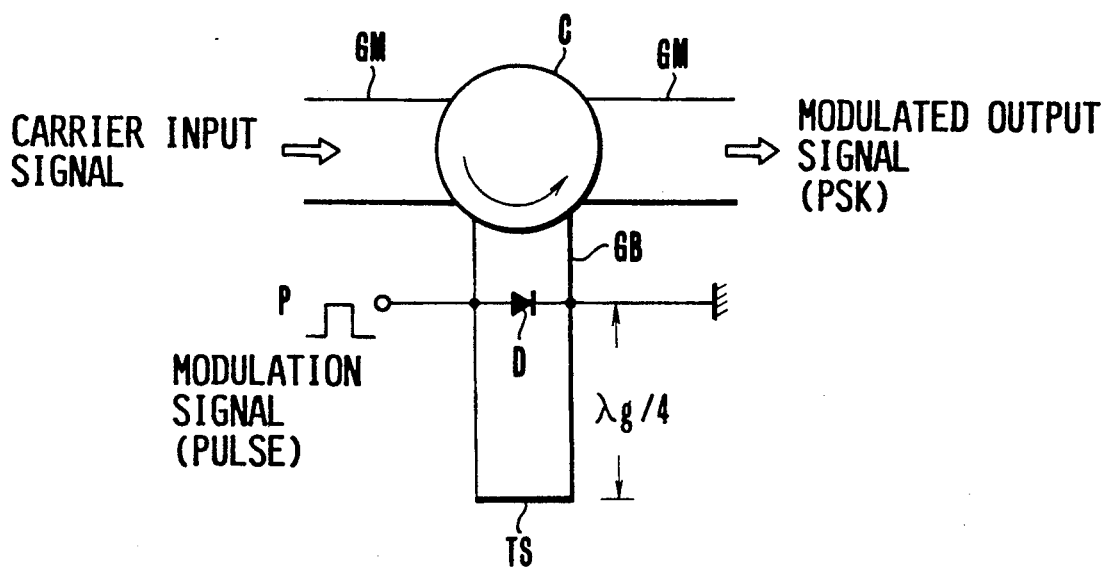
FIG. 6 is a structural circuit diagram for illustrating a prior art design.

In the embodiment shown in FIG. 1, the switching ratio of the PSK-modulated output signal is improved as compared to the prior art as shown in FIG. 6 even if the wave absorber MA is not attached to the first short-terminal TS1.

In practice, when turned ON, the diode D does not constitute a perfect short-terminal, so that some resistance remains, and a loss in carrier energy is caused thereby. This results in causing a difference in amplitude between the time when the PSK-modulated output signal has the 0-phase and the time when it has the $\pi$-phase.

According to the structure shown in FIG. 1, the amplitude difference at the 0-phase and $\pi$-phase in the PSK-modulated output signal is much decreased (by about 4 dB) as compared to the amplitude difference at the 0-phase and $\pi$-phase in the PSK modulated output signal in the prior art as shown in FIG. 6, even if the wave absorber MA is not attached to the first short-terminal TS1.

If the wave absorber MA is attached to the first short-terminal TS1, the equalization is further improved. The wave absorber MA is arranged experimentally by choosing numbers of pieces and area, shape, thickness, attached position, material, process work of production and the like of each piece, so as to minimize or to be zero at its best, the difference between the reflection energy from the first short-terminal TS1 in the first short circuit GB1 in the OFF-state of the diode D and in the second short circuit GB2 in the ON-state of the diode D. Then the difference in amplitude of the PSK-modulated output signals between the 0-phase and the $\pi$-phase can be minimized or eliminated.

Figure 3:
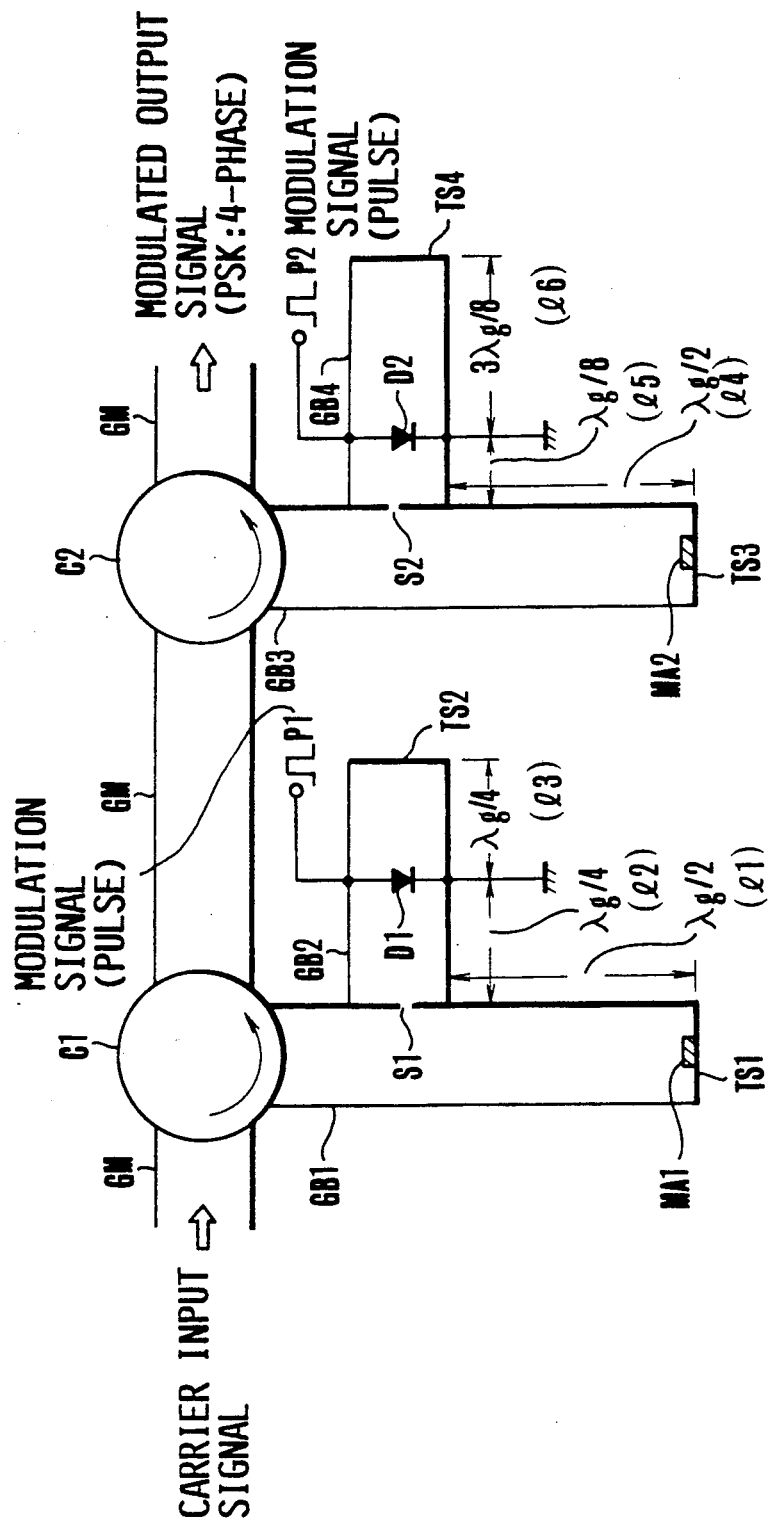
FIG. 3 is a structural circuit diagram showing a second embodiment of the present invention.

FIG. 3 shows a second embodiment of the present invention. According to the second embodiment, a microwave modulation circuit uses a waveguide having a rectangular section and obtains a 4-phase PSK-modulated signal at the output port. In this embodiment, it is assumed that the modulation circuit functions in the $TE_{10}$ mode.

The technique which connects a pathlength type modulation circuit like the one shown in FIG. 6, for example, in series with a main waveguide and obtains a 4-phase PSK output signal is already known in the art. The embodiment shown in FIG. 3 uses the same modulation circuit shown in FIGS. 1 and 2, as one of the two modulation circuits, while it uses a modulation circuit obtained by partly modifying the circuit structure shown in FIG. 1 as the other modulation circuit.

The embodiment shown in FIG. 3 comprises a first modulation circuit which consists fundamentally of a first circulator C1, a first short circuit GB1 and a second short circuit GB2, and a second modulation circuit which consists fundamentally of a second circulator C2, a third short circuit GB3 and a fourth short circuit GB4.

When viewed from the aspects of the solid, three-dimensional structure, the guide wavelength and the phase, the circuit structure of the first modulation circuit is the same as that of the first embodiment shown in FIGS. 1 and 2.

In the first modulation circuit, a branch point to the second short circuit GB2 is referred to as a "first branch point" and a slit S1 disposed at the first branch point is referred to as a "first slit". This second embodiment is the same as the first embodiment in that the inner surface of the wall of the waveguide of the second short circuit GB2 which is located nearer to the first short-terminal TS1 is set at the distance $\lambda_g/2$ from the first short-terminal TS1 and that at the first branch point, the first slit S1 is included in the cross-sectional plane of the junction of the second short circuit GB2 from the first short circuit GB1 and is parallel with the major side of its cross-sectional plane. The first slit S1 is positioned in an H-plane of the first short circuit GB1 at the center of the cross-sectional plane in cross-wise direction with respect to the axial direction of the first short circuit GB1.

The second embodiment is also the same as the first embodiment shown in FIG. 1 in that a diode D1 (which is referred to as a "first diode") is loaded in the second short circuit GB2 across the both H-planes at the position returning back the distance $\lambda_g/4$ from the second short-terminal TS2 toward the first branch point.

In the second modulation circuit, the third short circuit GB3 corresponds to the first short circuit GB1 of the first modulation circuit and the fourth short circuit GB4 of the second modulation circuit corresponds to the second short circuit GB2 of the first modulation circuit. Similarly, the relation of the solid, three dimensional structure of the main waveguide GM, the second circulator C2, the third short circuit GB3 and the fourth short circuit GB4 corresponds to that shown in FIG. 2, and these parts are indicated by C2, GB3 and GB4, respectively, which are substituted for C, GB1 and GB2 in FIG. 2.

Here, the short-terminals of the third and fourth short circuits GB3 and GB4 are referred to as "third short-terminal TS3" and "fourth short-terminal TS4", respectively. The fourth short circuit GB4 is branched from one of the H-planes of the third short circuit GB3 by means of an E-plane-T-junction and this branch point is referred to as a "second branch point".

The arrangement of a slit in the second modulation circuit is the same as the arrangement of the first slit in the first modulation circuit, in that at the second branch point the distance between third short-terminal TS3 of the third short circuit GB3 and the inner surface of the wall of the fourth short circuit GB4 which is located nearer to the third short-terminal TS3 is set to be $\lambda_g/2$, in that at the second branch point a slit S2 (referred to as "a second slit") is disposed in an H-plane of the third short circuit GB3 in cross-wise direction with respect to the axis of the third short circuit GB3 and in that the second slit S2 is included in the cross-sectional plane in parallel with the major side of the plane of the injunction and is positioned at the center of the cross-sectional plane in cross-wise direction with respect to the axis of the third short circuit GB3.

In the second modulation circuit, a diode D2 (which is referred to as a "second diode") is loaded across both H-planes in the fourth short circuit GB4 at the position having a distance $3\lambda_g/8$ from the fourth short-terminal TS4 towards the second branch point.

Also, in the embodiment shown in FIG. 3, the branch points of the respective short circuits GB1, GB2, GB3 and GB4 and the attaching points of the diodes loaded therein are represented by fractions of the guide wavelength $\lambda_g$. In FIG. 3, ($\lambda$1), ($\lambda$2), ($\lambda$3), ($\lambda$4), ($\lambda$5) and ($\lambda$6) represent the lengths of one of the most simple cases (m=1, n=0 and p=1).

In the case where two sets of the modulation circuits having the structure as shown in FIG. 6 are cascaded to obtain the 4-phase PSK output signal, it has been already known in the art that a predetermined logic circuit must be precedingly disposed to drive each diode loaded to the short-circuiting waveguides of each modulation circuit, and the pulses must be applied to both diodes through the predetermined logic circuit in synchronism with each other. The requirements also hold true of the case shown in FIG. 3. In other words, a predetermined logic circuit is arranged to control the first diode D1 and the second diodes D2, and pulse trains P1 and P2 having the same period, the same pulse width and coincidental phase are applied to each diode as the modulation signals for driving them.

The operation of the embodiment shown in FIG. 3 will be explained as below. The first modulation circuit operates when pulses are applied to the first diode D1 and the second diode D2 through the known logic circuit in the same manner as in the embodiment shown in FIG. 1. As to the second modulation circuit, since the second diode D2 exists at the position of a distance $3\lambda_g/8$ from the fourth short-terminal TS4 in the fourth short circuit GB4, the path length difference of the carrier between the second diode D2 and the fourth short-terminal TS4 becomes $3\lambda_g/4$ during one reciprocating travel of the carrier, which results in a phase difference $\pi/2$ according to changeover of the ON-state and the OFF-state of the diode D2, so that the 0 and $\pi/2$ phase signals can be obtained as the second diode D2 is operated ON and OFF.

Therefore, the 4-phase PSK-modulated signal can be obtained at the output port when the first modulation circuit and the second modulation circuit are combined with each other.

In the embodiment shown in FIG. 3, the wave absorber MA1/MA2 may be attached, whenever necessary, to the first short-terminal TS1 and/or third short-terminal TS3, in order to further improve the equalization in the 4-phase PSK signal in the same way as in the embodiment shown in FIG. 1.

Figure 4:
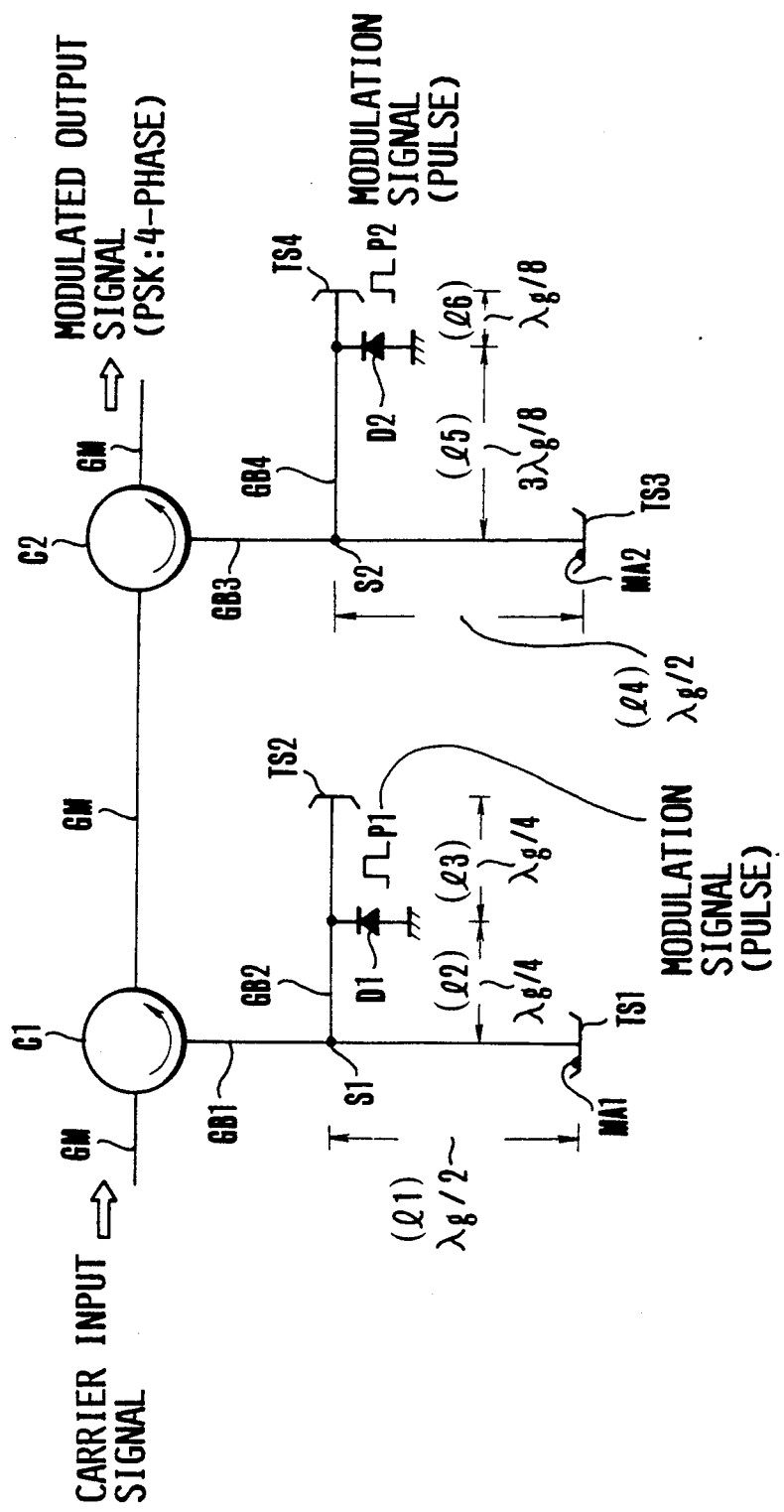
FIG. 4 is a structural circuit diagram showing a third embodiment of the present invention.

FIG. 4 shows a third embodiment of the present invention. The third embodiment shown in FIG. 4 further includes a fourth short circuit GB4 and a second diode D2 loaded to a position having a distance of $\lambda_g/8$ from a fourth short-terminal TS4.

In the embodiment as shown in FIG. 4, which uses a waveguide (having a rectangular section and using $TE_{10}$ mode), the solid, three-dimensional structures of a first modulation circuit and a second modulation circuit correspond to those of the first modulation circuit and the second modulation circuit shown in FIG. 2, and in this respect the third embodiment is almost similar to the embodiment shown in FIG. 3. The embodiment shown in FIG. 4 is different from the embodiment shown in FIG. 3 in the manner of loading position of the second diode D2 in the fourth short circuit GB4. In this regard, it is to be noted that FIG. 4 is shown by a customary simplified depiction method.

In FIG. 4, when pulse signals are applied to the first and second diodes D1 and D2 through a predetermined logic circuit, the path length difference of the carrier in the fourth short circuit GB4 becomes $\lambda_g/4$ between the second diode D2 and the fourth short-terminal TS4 according to changeover of the ON-state and the OFF-state of the second diode D2, so that 0 and $\pi/2$ phase signals can be obtained by this fourth short circuit GB4. Accordingly, the 4-phase PSK signal can be obtained by combining the first modulation circuit and the second modulation circuit.

Wave absorber MA1 and/or MA2 can be attached, whenever necessary, to the first short-terminal TS1 and/or the third short-terminal TS3 with the same purpose as explained in the case of FIG. 3.

The present invention provides the following advantageous effects. When the wave absorber is not attached to the first short-terminal in the embodiment shown in FIG. 1, the amplitude equalization of the modulated output signals in the ON-OFF states of the diode D is improved by about 4 dB in comparison with the prior art structure shown in FIG. 6 as described already.

The improvement can further be enhanced by attaching the wave absorber to the first short-terminal in the circuit structure shown in FIG. 1.

Figure 5:
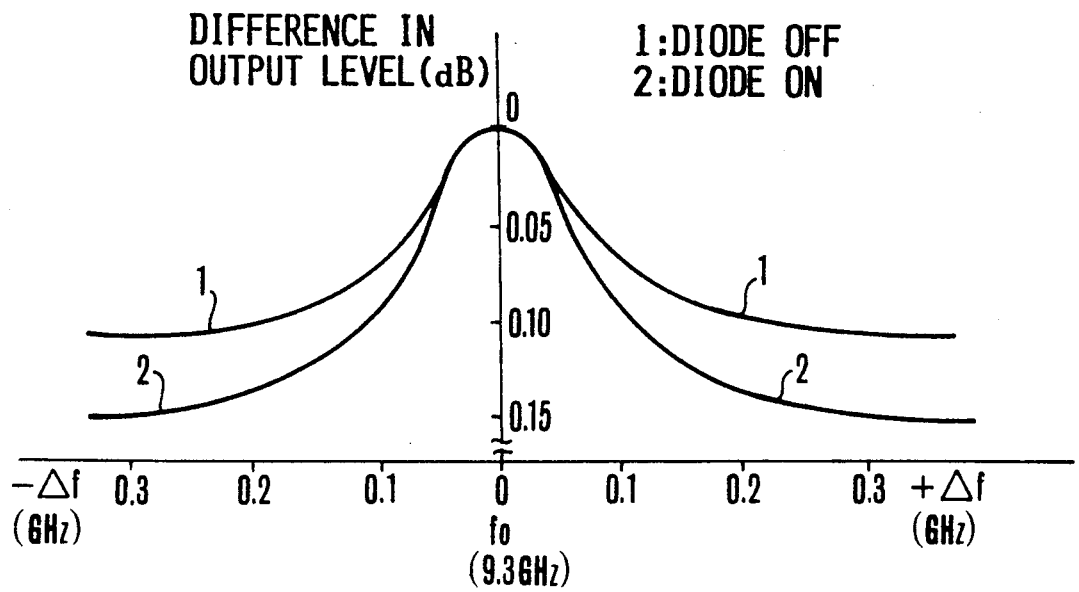
FIG. 5 is a diagram showing experimental results of the first embodiment shown in FIG. 1.

FIG. 5 shows the results of an experiment of the circuit structure shown in FIG. 1. In this case, it was assumed that the wave absorber made of carbon-impregnated styrol material which was in an almost or actual disk shape having an area corresponding to about 10% of that of the first short-terminal (the cross-sectional area of the first waveguide) and it was disposed approximately or just at the center of the first short-terminal. This experiment was carried out on or about 9 GHz of the carrier.

FIG. 5 shows a difference in level of the PSK-modulated output signals caused by shifting the frequency by $\Delta f$ above and below the center frequency $f_0$ in the "ON-state" and the "OFF-state" of the diode, provided that the levels of the PSK-modulated output signals in the ON-state and the OFF-state of the diode are brought to coincide with each other at the center frequency $f_0$.

As can be seen from FIG. 5, the amplitude of the respective PSK-modulated output signals in each case of the ON-state and the OFF-state of the diode has not so much difference even when the frequency shifts up and down from the center frequency. Accordingly, fine tuning can be effected.

In the embodiments for obtaining the 4-phase PSK-modulated output signal as shown in FIGS. 3 and 4, the equalization can be likewise enhanced if the wave absorbers are loaded to the first short-terminal and/or the third short-terminal in each of the first and second modulation circuits.

Experiments must be conducted, as described above, in order to find out the most suitable numbers of pieces and area, shape, thickness, attaching position, material, machining, and the like of each piece, of the wave absorber.

Additionally, each of the modulation circuits shown in FIGS. 1, 3 and 4 provides an improved switching ratio in comparison with the modulation circuit shown in FIG. 6.

Although the present invention has thus been described with reference to some preferred embodiments thereof, the invention is not particularly limited thereto but can of course be changed or modified in various manners without departing from the scope and spirit thereof.

What is claimed is:

1. A pathlength type microwave modulation circuit comprising:
    first short circuit means;
    second short circuit means having a length of $m \times \frac{1}{2} \times \lambda_g$, where $\lambda_g$ is a guide wavelength and m is a positive integer, branched from said first short circuit means by a slit coupling at a position distant from a first short-terminal of said first short circuit means by a length of $m \times \frac{1}{2} \times \lambda_g$;
    and a switching diode loaded on said second short circuit means at a position distant from a second short-terminal of said second short circuit means by a length of $\frac{1}{4} \times (2n+1) \times \lambda_g$, where n is 0, or a positive integer.

2. A pathlength type microwave modulation circuit according to claim 1, wherein at least one wave absorber is attached to said first short-terminal.

3. A pathlength type microwave modulation circuit comprising first and second microwave modulation circuits, connected together in a cascade relation;
    said first microwave modulation circuit including first short circuit means, second short circuit means having a length of $m \times \frac{1}{2} \times \lambda_g$, where $\lambda_g$ is a guide wavelength and m is a positive integer, branched from said first short circuit means by a slit coupling at a position distant from a first short-terminal of said first short circuit means by a length of $m \times \frac{1}{2} \times \lambda_g$, and a first switching diode loaded on said second short circuit means at a position distant from a second short-terminal of said second short circuit means by a length of $\frac{1}{4} \times (2n+1) \times \lambda_g$, where n is 0 or a positive integer;
    and said second microwave modulation circuit including third short circuit means, fourth short circuit means having a length of $m \times \frac{1}{2} \times \lambda_g$ branched from said third short circuit means by a slit coupling at a position distant from a third short-terminal of said third short circuit means by a length of $m \times \frac{1}{2} \times \lambda_g$, and a second switching diode loaded on said fourth short circuit means at a position distant from a fourth short-terminal of said fourth short circuit means by a length of $(p/2 \pm \frac{1}{4}) \times \lambda_g$, where $p = 0$ or a positive integer, provided that only a positive sign of the $\pm$ sign is effective when $p = 0$.

4. A pathlength type microwave modulation circuit according to claim 3, wherein wave absorbers are attached to the first short-terminal and/or the third short-terminal.

5. In a pathlength type microwave modulation circuit having a main waveguide section for a carrier signal, a circulator coupled to said main waveguide section for transferring said carrier signal and a modulated signal, and a first waveguide section having first short circuit means branched from said circulator, the improvement comprising:
    a second waveguide section having second short circuit means and having a length $m \times \frac{1}{2} \times \lambda_g$, where $\lambda_g$ is a guide wavelength and m is a positive integer, said second waveguide section being branched from said first waveguide section by a slit coupling at a position distant from a first short-terminal of said first waveguide section by a length of $m \times \frac{1}{2} \times \lambda_g$; and
    a switching diode loaded on said second waveguide section at a position distant from a second short-terminal of said second waveguide section by a length $\frac{1}{4} \times (2n+1) \times \lambda_g$, where n is 0 or a positive integer, a modulation signal being applied to said diode,
    whereby the level of the modulated output signal is equalized during the on/off periods of the diode.

* * * * *

UNITED STATES PATENT AND TRADEMARK OFFICE
CERTIFICATE OF CORRECTION

PATENT NO.   :   5,017,893

DATED        :   May 21, 1991

INVENTOR(S)  :   Tetsujirou Izumi and Akihiko Iida

It is certified that error appears in the above-identified patent and that said Letters Patent is hereby corrected as shown below:
On title page, item [73]
Assignee's address to be corrected as follows:

3-1848-1, Ohono-machi, Ichikawa-shi, Chiba-ken, Japan

Signed and Sealed this

Eighteenth Day of January, 1994

Attest:

BRUCE LEHMAN

*Attesting Officer*   *Commissioner of Patents and Trademarks*